United States Patent [19]

Baker

[11] Patent Number: 4,562,406
[45] Date of Patent: Dec. 31, 1985

[54] CURRENT CONTROLLED AMPLIFIER

[75] Inventor: Jay S. Baker, San Carlos, Calif.

[73] Assignee: Ampex Corporation, Redwood City, Calif.

[21] Appl. No.: 418,900

[22] Filed: Sep. 16, 1982

[51] Int. Cl.$^4$ .............................................. H03F 1/26
[52] U.S. Cl. ..................................... 330/85; 330/149; 330/310
[58] Field of Search ................. 330/85, 149, 278, 310, 330/311

[56] References Cited

U.S. PATENT DOCUMENTS 3,918,005  11/1975  Bruckenstein ......................... 330/85
4,114,115  9/1978  Minnis ................................... 330/85

OTHER PUBLICATIONS

Todd, C. C. "A Monolithic Analog Compandor" IEEE Journal of Solid State Circuits, vol. SC-11, No. 6, Dec. 1976.

Primary Examiner—James B. Mullins
Assistant Examiner—G. Wan
Attorney, Agent, or Firm—Elizabeth E. Strnad; Joel D. Talcott

[57] ABSTRACT

An improved voltage controlled amplifier employing an operational transconductance amplifier which is temperature independent and offering an improved dynamic range for the input signal is disclosed. An operational amplifier configured in the inverting mode is used as an input device having a first operational transconductance amplifier in the feedback path as a gain control element. The output of the operational amplifier provides a control voltage to effectively drive a second operational transconductance amplifier.

3 Claims, 3 Drawing Figures

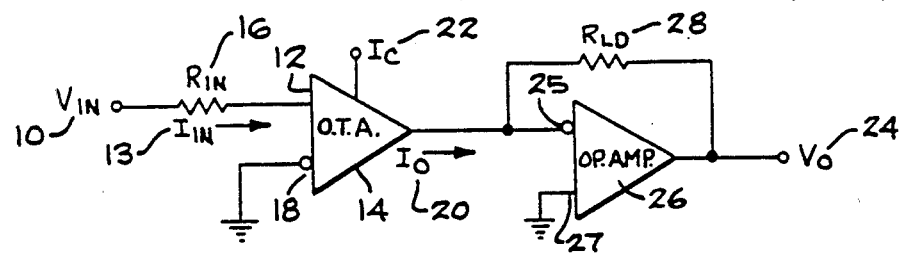
FIG_1 (PRIOR ART)
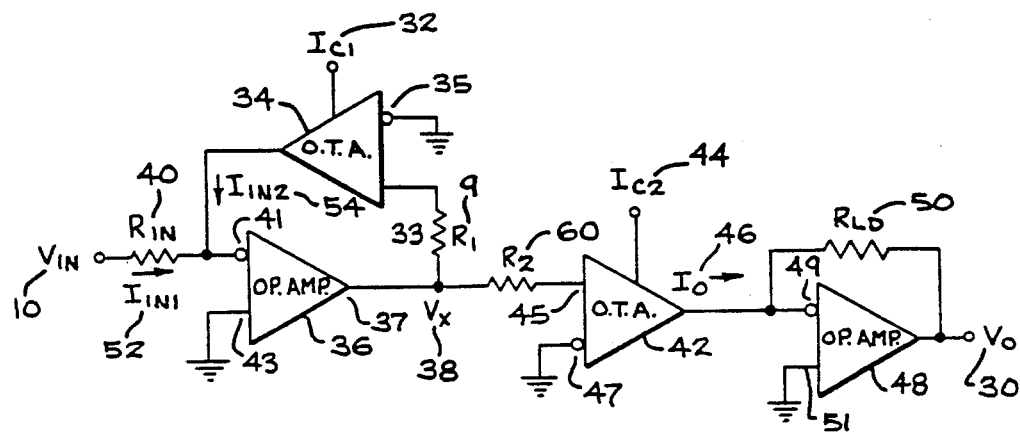
FIG_2
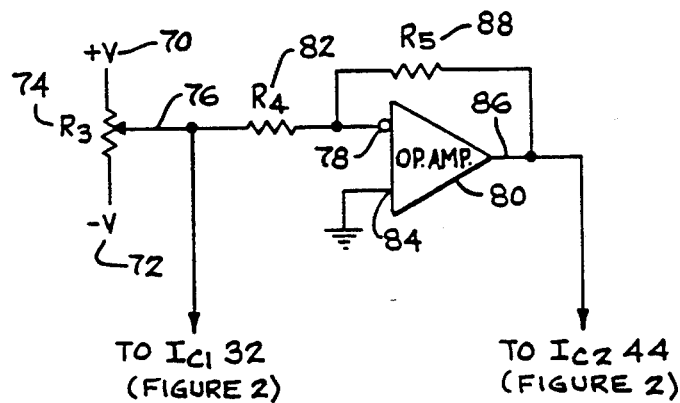
FIG_3

CURRENT CONTROLLED AMPLIFIER

BACKGROUND OF THE INVENTION

This invention relates generally to the field of remote controlled gain devices, and more particularly voltage controlled amplifiers employing operational transconductance amplifiers.

Broadly speaking a remote controlled gain device is a device useful for effecting a change in the amount of amplification of a signal, termed the input signal, from a point of control removed from the location at which the actual change in amplification is occurring.

The ability to remotely control gain is desirable for a number of reasons. In the control of voltages associated with audio frequencies, for example, it is frequently desirable to control the amount of amplification of an input signal from a remote location. Without the use of a gain device which could be remotely controlled, this would require the routing of the input signal to the remote location for direct adjustment thereon. Such remote routing of an input signal is highly undesirable as it permits the possibility of compromising the integrity of the input signal. In particular, the remote routing of an input signal permits exposure of the input signal to unwanted signals which would thereafter be included with the input signal. Once this has occurred it is not possible from a practical standpoint to remove the unwanted signal or its effects on the input signal, without an effect therefrom remaining on the input signal.

In addition to the possibility of exposure of the input signal to unwanted signals, the remoting of an input signal usually results in a degrading of the input signal from the remoting process itself. This frequently occurs due to the effect of the capacitance of the wire used to physically transport the input signal to the remote location. The ultimate effect of such a capacitance effect is a loss of high frequency information.

Consequently, when it becomes necessary to remotely control the gain of an input signal, it is desirable to avoid remoting the input signal itself, and instead remote a control signal which will indirectly control the gain of the input signal.

Remote controlled gain devices find use in a wide variety of applications. Professional audio mixing boards frequently have the point of control removed from the associated electronics. Consequently voltage controlled amplifiers are used to control the actual desired gain applied to the particular input signals by the use of a control voltage which is adjusted from a remotely located control panel.

Professional audio and video tape recorders also frequently employ the use of a voltage controlled amplifier in the control of various signals, as it is often desirable to strictly limit the routing of an input signal. Consequently, voltage controlled amplifiers are frequently used, being placed directly on the printed circuit board, and routing only the associated control signal to the recorder control panel.

Voltage controlled amplifiers also find use in signal processing applications wherein it is necessary to control the gain applied to an input signal in response to a complex electrical signal which has been derived as the result of other signal processing. In particular, audio signal processing equipment such as expanders and compressors use voltage controlled amplifiers. In such equipment, the amount of gain applied to an input signal is dynamically varied in response to the results of a complex mathematical algorithm being performed on the input signal.

In the past, voltage controlled amplifiers have been implemented using the basic principle of a resistive voltage divider network. This approach is based on the fact that the drain to source characteristics of a field effect transistor are essentially resistive in nature, in an amount determined by the potential applied to the gate. Consequently a voltage controlled attenuator can be implemented by employing a single resistor in series with a field effect transistor. In particular, the signal of interest would be applied to one terminal of the resistor, with the second terminal connected to the drain of the field effect transistor. The source of the field effect transistor would be connected to ground, with the control voltage applied to the gate. The attenuated output signal would then appear on the drain terminal of the field effect transistor.

Consequently by varying the control voltage applied to the gate of the field effect transistor, the effective d.c. resistance which is shunting the input signal to ground is correspondingly controlled. The result is a variation in the amplitude of the input signal in accordance with variations in the amplitude of the control signal.

Such an implementation of a voltage controlled amplifier has a number of characteristics of interest.

First, as there is an absence of active devices in the signal path, a very large dynamic range is possible for the input signal. Dynamic ranges in excess of 100 db are common.

While a large dynamic range is possible for differences in amplitude of the input signal, the corresponding amount of control is significantly less. In particular the range of control over an input signal is typically approximately 40 db. This results from the parameters which are associated with the devices. In particular, typical values for the first resistor are 10 K ohms, and typical drain to source ON resistance for field effecting transistor is 100 ohms. As the amount of gain control possible in this approach is dependent upon the ratio of these two resistances, clearly the limiting value is drain to source resistance for the field effect transistor.

As the principle involved is basically one of a resistive voltage divider network, and the limiting factor the drain to source ON resistance of the field effect transistor, an improvement in the amount of gain control is possible by resistively coupling a second field effect transistor in parallel with the first, and taking the attenuated output signal from the drain terminal of the second field effect transistor. The control signal is applied simultaneouly to the gates of the first and second field effect transistor. Such an arrangement results in a decrease in the effective resistance which shunts the input signal to ground. In such an arrangement it is possible to achieve a control range of 80 db for the control signal.

Further characteristics associated with the above described implementation of a voltage controlled amplifier include an exponential relationship between the control signal and the effect on the input signal. This is a desirable result, as the response of the human ear to differences in loudness is exponential.

A further characteristic of such a voltage controlled amplifier is the nature of second harmonic distortion. The amount of second harmonic distortion present in the output signal is not constant, and tends to increase with increase in amplitude of the input signal. This is an undesirable result.

An additional characteristic is of interest. As the above implementation is basically one of a resistive voltage divider, such a device cannot provide gain. To the contrary, only attentuation of the input signal is possible, in amounts determined by the magnitude of the control signal.

A final characteristic is of practical importance. As a semiconductor device is used, the resulting device exhibits a temperature dependence. In particular, the amount of attenuation on the input signal is in part determined by the temperature of the field effect transistors used. This is also an undesirable effect.

An alternate approach to the design of a voltage controlled amplifier using field effect transistors in a voltage divider scheme is possible using operational transconductance amplifiers.

An operational transconductance amplifier is basically an electrical device which will produce an output current equal to the product of three terms: a first input current, a second input current, and a constant, K. The first input current is associated with the input signal, and the second input current is associated with the control of the first input current. The constant, K, is a number associated with parameters relating to the characteristics of the particular operational transconductance amplifier used. In particular, the temperature of the operational transconductance amplifier does affect the value of the constant, K.

When a voltage controlled amplifier is implemented using an operational transconductance amplifier, a number of characteristics of interest result.

The dynamic range of the input signal is typically 80 db, with a corresponding range of control of the control signal of approximately 90 db. Furthermore, as an operational transconductance amplifier is an active device, implementing a voltage controlled amplifier using operational transconductance amplifiers produces a controllable device capable of producing gain on the input signal. This is a significant advantage over the previously discussed implementation of a voltage controlled device employing field effect transistors.

However, while the use of operational transconductance amplifiers does so offer advantages over the use of field effect transistors in the implementation of a voltage controllable device, there are a number of disdvantages which result directly from the use of an operational transconductance amplifier.

First, the relation between the control signal and the input signal is a linear one, i.e., the output signal produced by the operational transconductance amplifier is equal to the input signal multiplied by a constant and the value of the control signal. As voltage controlled amplifiers are frequently used in the processing of audio information, an exponential relationship between the input signal and the control signal is desirable.

A second disadvantage present in the use of an operational transconductance amplifier relates to the amount of second harmonic distortion. While distortion of any type is clearly undesirable, second harmonic distortion in an operational transconductance amplifier is related to input offset current and voltage, and can consequently be minimized by adjusting the input offset current to a minimum value. As the amount of second harmonic distortion is related to the magnitude of the input offset current, the resulting amount of second harmonic distortion appearing in the output signal is independent of the amplitude of the input signal. However, this does present the disadvantage that for input signals having a low level, the amount of second harmonic distortion is proportionally larger. This characteristic is one of the major disadvantages to the use of an operational transconductance amplifier in the implementation of voltage controlled amplifier.

A further disadvantage in the use of operational transconductance amplifiers in the implementation of a voltage controlled amplifier relates to the level of input noise. In particular, from a practical standpoint, the lower limit on the useable level for input signals is determined by the input noise of the first operational transconductance amplifier in a voltage controlled amplifier. Consequently this problem is particularly significant with the use of operational transconductance amplifiers with low level signals.

A further disadvantage presented by the use of an operational transconductance amplifier relates to the amount of third harmonic distortion produced. As this results primarily from saturation of the operational transconductance amplifier due to large signal amplitudes, clearly this disadvantage can be limited by restricting the maximum level permitted for the output signal. This effectively limits the maximum amplitude of the output signal produced by the operational transconductance amplifier. This characteristic is likewise considered as one of the major disadvantages of the use of an operational transconductance amplifier in the implementation of a voltage controlled amplifier.

Consequently it is observed that the major disadvantages to the use of an operational transconductance amplifier in the implementation of a voltage controlled amplifier relate to the amount of distortion produced when operating the device close to the upper and lower limits of the input signal. The net effect is a reduction in the dynamic range which can exist on the input signal.

A final disadvantage presented by the use of an operational transconductance amplifier in the implementation of voltage controlled amplifiers is the temperature dependence of the gain of the operational transconductance amplifier. This characteristic is clearly undesirable.

SUMMARY OF INVENTION

In accordance with the present invention, an improved voltage controlled amplifier is disclosed employing operational transconductance amplifiers. In particular, an operational amplifier configured in the inverting mode having a first operational transconductance amplifier in its feedback path is used as an input circuit to a second operational transconductance amplifier. By placing the first operational transconductance amplifier in the feedback path of an operation amplifier configured in the inverting mode, undesirable effects present in the output from the first operational transconductance amplifier produce effects having an opposite polarity from the corresponding effects in the output of the second operational transconductance amplifier. As the first and second operational transconductance amplifiers are implemented on the same silicon chip, the undesirable effects of temperature and input offset bias current will be almost identical for each. Consequently, as the undesirable effects on the output signal from the operational transconductance amplifier due to temperature and input offset current from the first operational transconductance amplifier are inverted by the inverted mode to operation of the operational amplifier, and the output of the operational amplifier provides the input signal to the second operational transconductance amplifier, the undesirable effects of temperature and input offset current effectively are cancelled, and do not appear in the output signal from the second operational transconductance amplifier. This results in a significant reduction in temperature dependence of gain and second harmonic distortion in the resulting output signal.

As two operational transconductance amplifiers are employed in the above described design, by arranging the respective control currents thereto such that an inverse relationship exists between the two control currents, the gain of the resulting voltage controlled amplifier will be exponential.

DESCRIPTION OF THE FIGURES

FIG. 1 illustrates an operational transconductance amplifier configured for remote control of the gain applied to an input signal.

FIG. 2 illustrates the partial implementation of a voltage controlled amplifier in accordance with the present invention employing operational transconductance amplifiers.

FIG. 3 illustrates a typical circuit to provide the control currents to the circuit of FIG. 2.

DETAILED DESCRIPTION

FIG. 1 illustrates a typical circuit configuration of a voltage control amplifier employing an operational transconductance amplifier. An input voltage $V_{in}$ 10 is coupled to the non-inverting input 12 of an operational transconductance amplifier 14 by series input resistor $R_{in}$ 16. The inverting input 18 of operational transconductance amplifier 14 is grounded. Operational transconductance amplifier 14 produces an output current $I_o$ 20 which is proportional to input voltage $V_{in}$ 10 multiplied by control current $I_c$ 22. The output current $I_o$ 20 is converted to an output voltage $V_o$ 24 by operational amplifier 26 and associated feedback resistor $R_{1d}$ 28. Output current $I_o$ 20 of operational transconductance amplifier 14 is coupled to the inverting input 25 of operational amplifier 26. The non-inverting input 27 of operational amplifier 26 is grounded. The output of operational amplifier 26 is coupled to the inverting input 25 of operational amplifier 26 by resistor $R_{1d}$ 28.

The relationship between the output voltage $V_o$ 24 and the input voltage $V_{in}$ 10 are apparent from the following mathematical relationships.

The output current $I_o$ 20 from operational transconductance amplifier 14 is related to input current $I_{in}$ 13 by $$I_o = I_{in} K\, I_c \quad (1)$$

and $I_{in}$ 13 is related to $V_{in}$ 10 by $$V_{in} = R_{in} I_{in} \quad (2)$$

Substituting the value for $I_{in}$ from equation 2 into equation 1 yields $$I_o = (V_{in}/R_{in}) K\, I_c \quad (3)$$

However, with reference to operational amplifier 26, $$V_o = I_o R_{1d} \quad (4)$$

Substituting $I_o$ from equation 4 into equation 3 yields $$V_o/V_{in} = -(R_{1d}/R_{in}) K\, I_c \quad (5)$$

Consequently from equation 5 it is apparent that the output voltage $V_o$ 24 is related to the input voltage $V_{in}$ 10 by a constant multiplied by control current $I_c$ 22.

However, from inspection of equation 5, several characteristics are apparent.

First, the gain of the resulting voltage control amplifier is linearly related to the control current $I_c$. As voltage controlled amplifiers are frequently used in audio applications by an expotential rather than a linear relationship is desirable.

As the constant term K appearing in equation 5 originally appeared in equation 1 which related to the output current $I_o$ 20 to the input current $I_{in}$ 13 of operational transconductance amplifier 14 is a temperature related term, the resulting gain of the voltage controlled amplifier expressed by equation 5 is temperature dependent.

In addition to the above short comings, the dynamic range of the voltage controlled amplifier implemented with operational transconductance amplifiers in accordance with FIG. 1 is limited by the second harmonic distortion resulting from input offset currents, input transistor noise and third harmonic distortions resulting from the clipping of the input signal when the amplitude thereof approaches the upper limit of its range. Consequently the dynamic range of the input signal is limited by the characteristics associated with the operational transconductance amplifier 14.

In accordance with the present invention, a voltage controlled amplifier employing two operational transconductance amplifiers is disclosed in FIG. 2.

Referring to FIG. 2 an output voltage $V_o$ 30 is produced in response to an input $V_{in}$ 10 and control current $I_{c1}$ 32 and control current $I_{c2}$ 44.

In particular, input voltage $V_{in}$ 10 is coupled to the inverting input 41 of operational amplifier 36 by input resistor $R_{in}$ 40. The non-inverting input 43 of operational amplifier 36 is connected to ground. The output 37 of operational amplifier 36 is coupled to the non-inverting input 33 of operational transconductance amplifier 34 by resistor $R_1$ 9. The inverting input 35 of operational transconductance amplifier 34 is connected to ground. The gain of operational transconductance amplifier 34 is controlled by control current $I_{c1}$ 32. The output of operational transconductance amplifier 34 is coupled to the inverting input 41 of operational amplifier 36. The output $V_x$ 38 of operational amplifier 36 is coupled to the non-inverting input 45 of a second operational transconductance amplifier 42. The inverting input 47 of operational transconductance amplifier 42 is connected to ground. The gain of operational transconductance amplifier 42 is controlled by control current $I_{c2}$ 42. The output $I_o$ 46 of output transconductance amplifier 42 is coupled to the inverting input 49 of operational amplifier 48. The non-inverting input 51 of operational amplifier 48 is connected to ground. The output $V_o$ 30 of operational amplifier 48 represents the output of the voltage controlled amplifier, and is couped to the inverting input 49 of operational amplifier 48 by resistor $R_{1d}$ 50.

The relation of output voltage $V_o$ 30 to the input voltage $V_{in}$ 10 and control currents $I_{c1}$ 32 and $I_{c2}$ 44 is apparent from the following.

As the inverting input 41 of operational amplifier 36 is approximately at ground potential, $$I_{in1} = V_{in}/R_{in} \quad (6)$$

In a similar manner $$I_{in2} = (V_x/R_1) K I_{c1} \qquad (7)$$

As $I_{in1} = -I_{in2}$, $$V_{in}/R_{in} = (V_x/R_1) K I_{c1} \qquad (8)$$

Solving for $V_x$ $$V_x = (V_{in} R_1)/(R_{in} K I_{c1}) \qquad (9)$$

Referring to operational transconductance amplifier 42, $$I_o = (V_x/R_2) K I_{c2} \qquad (10)$$

Substituting $V_x$ from equation 9 into equation 10, and solving for $I_o$ yields $$I_o = (V_{in} R_1 I_{c2})/(R_{in} I_{c1} R_2) \qquad (11)$$

By setting $R_1 = R_2$ $$I_o = (V_{in}/R_{in})/(I_{c2}/I_{c1}) \qquad (12)$$

However, $$V_o = I_o R_{1d} \qquad (13)$$

Substituting $I_o$ from equation 13 into equation 12, and solving from $(V_o/V_{in})$ $$V_o/V_{in} = (R_{1d}/R_{in})(I_{c2}/I_{c1}) \qquad (14)$$

However, if $I_{c1} = 1/I_{c2}$, then $$V_o/V_{in} = (R_{1d}/R_{in}) I_{c2})(I_{c2}) \qquad (15)$$

Consequently from inspection of equation 15 it is apparent that by setting the value of resistor $R_1$ 9 equal to the value of resistor $R_2$ 60 and relating control current $I_{c2}$ 44 to control current $I_c$ 32 by an inverse relationship, the gain of the resulting voltage control amplifier will be proportional to a constant equal to the ratio of resistor $R_{1d}$ 50 divided by the value of resistor $R_{in}$ 40 multiplied by the value of control current $I_{c2}$ 44 squared.

In addition, from inspection of equation 15 it will be apparent that the temperature dependent term K which relates the output current of a transconductance amplifier to its control current and the resulting input current has been eliminated. Consequently the voltage controlled amplifier illustrated in FIG. 2 is temperature independent.

Furthermore, by inspection of equation 15 it is apparent that the gain of the voltage controlled amplifier is controlled by the square of the control current $I_{c2}$ 44. As previously discussed, this is a desirable result.

In addition, by configuring output transconductance amplifier 34 in the feedback path of operational amplifier 36 operating in the inverting mode, the effects due to input offset currents on the output of operational transconductance amplifier 34 will be inverted in the output $V_x$ 38 of operational amplifier 36. As $V_x$ 38 serves as the input for operational transconductance amplifier 42, the effects of input offset currents produced by output transconductance amplifier 42 will be effectively cancelled in the resulting output $V_o$ 30.

In addition to the above advantages, the voltage controlled amplifier illustrated in FIG. 2 offers the ability to respond to an input signal having a greater dynamic range than was previously possible by voltage controlled amplifiers employing operational transconductance amplifiers. This result follows from the use of operational amplifier 36 as an input device.

In particular, the amount of input noise present in currently available operational amplifiers is approximately two orders of magnitude better than the input noise present in currently available output transconductance amplifiers. Consequently the use of operational amplifier 36 as the input stage provides additional benefits beyond eliminating temperature and offset bias problems. When the level of $V_{in}$ 10 is low, the control current $I_{c1}$ is adjusted such that $V_{in}$ 10 is amplified up to a level above the noise floor of operational transconductance amplifier 42. On the other extreme, when the level of $V_{in}$ 10 is at a large level which would otherwise result in clipping at the input stage of an operational transconductance amplifier, $I_{c1}$ is adjusted such that the level of $V_{in}$ 10 is reduced below the critical upper level for operational transconductance amplifier 42. Consequently, the voltage controlled amplifier as above discussed exhibit a capability to respond to an input signal having a significantly increased dynamic range. In the preferred embodiment illustrated in FIG. 2, the dynamic range is approximately 111 db.

The circuit illustrated in FIG. 3 is a unity gain inverter for producing the respective control currents $I_{c1}$ 32 and $I_{c2}$ 44 from a control voltage. In particular, opposite polarity supply voltages $+V$ 70 and $-V$ 72 are applied to the respective ends of resistor $R_3$ 74. The desired control voltage 76 supplies control current $I_{c1}$ 32 and is simultaneously coupled to the inverting input 78 of operational amplifier 80 by resistor $R_4$ 82. The non-inverting input 84 of operational amplifier 80 is connected to ground. The output 86 from operational amplifier 80 supplies control current $I_{c2}$ 44, and is simultaneously coupled to the inverting input 78 of operational amplifier 80 by resistor $R_5$ 88.

While the preferred embodiment of the present invention has been described, many variations on the above would be apparent to one of ordinary skill in the art. Such variations would be encompassed by the present inventive concept which is to be limited only by the following claims.

What is claimed is:

1. Apparatus for remotely controlling the amplification of an input signal by an amplifier in response to a control current, comprising:

a first inverting voltage amplification means having an input and an output;

a first coupling means for coupling the input signal to the input of said first inverting voltage amplification means;

a first current amplification means for producing an output current responsive to the product of an input current and a control current having the output current coupled to the input of the first inverting voltage amplification means;

a second coupling means for coupling the output of the first inverting voltage amplification means to the input of the first current amplification means;

a second current amplification means for producing an output current responsive to the product of an input current and a control current;

a second coupling means for coupling the output of the first inverting voltage amplification means to the input of said second current amplification means;

conversion means for converting the output of said second current amplification means to a corresponding voltage; and, control means, responsive to a control signal, for producing a first and second control signal to control the first and second current amplification means respectively.

2. Apparatus for remotely controlling the amplification of an input signal referenced to electrical ground by an amplifier in response to a control current, comprising:

a first operational amplifier having a non-inverting input and an inverting input and an output, with the non-inverting input connected to electrical ground;

a first resistor having a first and a second terminal with the first terminal connected to the input signal and the second terminal connected to the inverting input of the first operational amplifier;

a first operational transconductance amplifier having a non-inverting and an inverting input a control input, and an output, with the inverting input connected to electrical ground, and the output connected to the inverting input of the first operational amplifier;

a second resistor having a first and a second terminal with the first terminal connected to the output of the first operational amplifier, and the second terminal connected to non-inverting input of the first operational transconductance amplifier;

a second operational transconductance amplifier having a non-inverting and an inverting input, a control input and an output, with the inverting input connected to ground;

a third resistor having a first and a second terminal with the first terminal connected to the output of the first operational amplifier and the second terminal connected to the non-inverting input of the second operational transconductance amplifier;

a second operational amplifier having a non-inverting input and an inverting input and an output, with the non-inverting input connected to electrical ground, and the inverting input connected to the output of the second operational transconductnce amplifier;

a fourth resistor having a first and a second terminal with the first terminal connected to the output of the second operational amplifier and the second terminal connected to the inverting input of the second operational amplifier;

control means responsive to a control signal for supplying a first control current to the control input of the first operational transconductance amplifier and a second control current to the control input of the second operational transconductance amplifier.

3. Apparatus as recited in claim 2, wherein said control means comprises:

a potentiometer having a first, second and third terminal with the first terminal connected to a first voltage, the second terminal connected to a second voltage, and the third terminal connected to the control input of the first operational transconductance amplifier;

a third operational amplifier having an inverting input, a non-inverting input and an output with the non-inverting input connected to electrical ground, and the output connected to the control input of the second transconductance amplifier;

a fifth resistor having a first and a second terminal with the first terminal connected to the third terminal of the potentiometer, and the second terminal connected to the inverting input of the third operational amplifier; and, a sixth resistor having a first and a second terminal with the first terminal connected to the inverting input of the third operational amplifier and the second terminal connected to the output of the third operational amplifier.

* * * * *

UNITED STATES PATENT AND TRADEMARK OFFICE
CERTIFICATE OF CORRECTION

PATENT NO. : 4,562,406

DATED : December 31, 1985

INVENTOR(S) : Jay S. Baker

It is certified that error appears in the above-identified patent and that said Letters Patent is hereby corrected as shown below:

Column 7, line 9, "$V_x=(VinRl)/(Rin\ KIcl)$ (9)" should read --$V_x=(V_{in}\ R_1)\ /\ (R_{in}\ K\ I_{cl})$ (9)--;

Column 7, line 19 "By setting $R_1=R_2$" should read --By setting $R_1=R_2$--;

Column 7, line 21 "$I_o=(V_{in}/R_{in})/(I_{c2}/I_{cl})$ (12)" should read --$I_o = (V_{in}/R_{in})\ /\ (I_{c2}/I_{cl})$ (12)--.

Signed and Sealed this

Thirteenth Day of May 1986

[SEAL]

Attest:

Attesting Officer

DONALD J. QUIGG

Commissioner of Patents and Trademarks